United States Patent [19]

DeTommasi

[11] 4,045,712

[45] Aug. 30, 1977

[54] VOLTAGE RESPONSIVE SWITCHES AND METHODS OF MAKING

[75] Inventor: Arthur N. DeTommasi, Newtonville, N.Y.

[73] Assignee: General Electric Company, Schenectady, N.Y.

[21] Appl. No.: 666,606

[22] Filed: Mar. 15, 1976

Related U.S. Application Data

[62] Division of Ser. No. 554,724, March 3, 1975, Pat. No. 3,976,811.

[51] Int. Cl.² .......................... H01C 7/10; F21K 5/02
[52] U.S. Cl. .................................... 315/323; 252/518; 338/21; 431/95 A
[58] Field of Search .............. 315/35, 36, 241 P, 323; 317/67, 68; 338/20, 21; 431/95 A; 354/132, 143; 252/512, 518

[56] References Cited

U.S. PATENT DOCUMENTS 3,969,066  7/1976  Smialek et al. ................... 431/95 A

FOREIGN PATENT DOCUMENTS 959,533  12/1974  Canada .......................... 315/241 P Primary Examiner—Eugene R. La Roche
Attorney, Agent, or Firm—Jerome C. Squillaro; Joseph T. Cohen

[57] ABSTRACT

A method of making a voltage sensitive switch characterized by an irreversible change in resistance from a high resistance state greater than one megohm to a low resistance state less than approximately one hundred ohms is described as comprising heating substantially pure grade copper in an oxidizing environment for a sufficient time to oxidize the outer surface of the copper powder, mixing the oxidized copper powder with a binder and applying the mixture to a pair of spaced electrodes.

6 Claims, 4 Drawing Figures

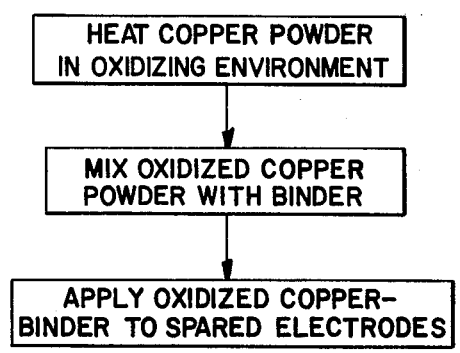
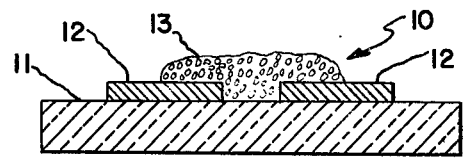
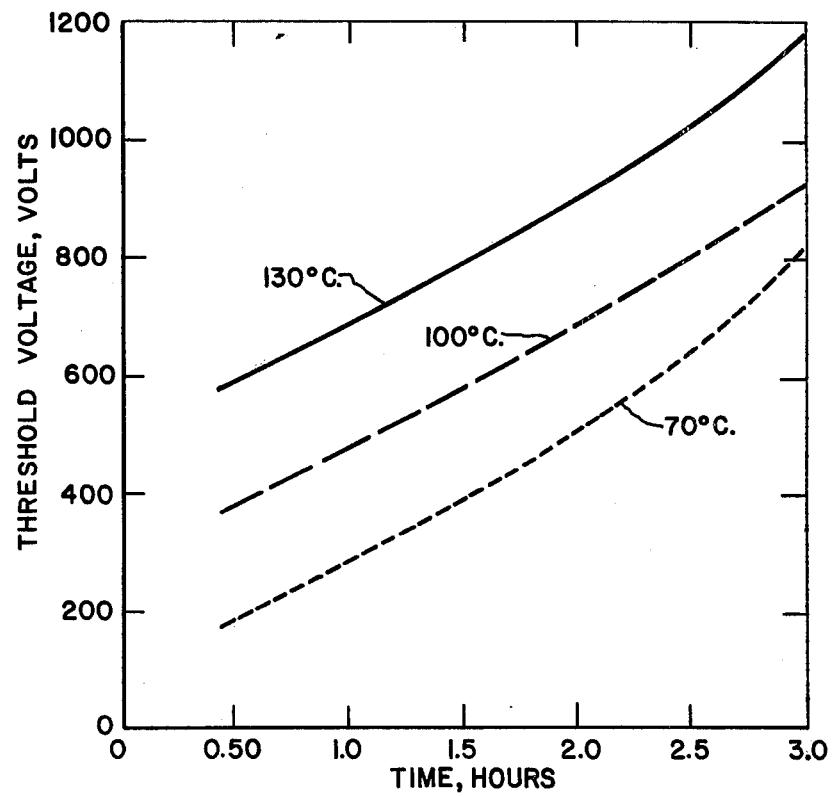
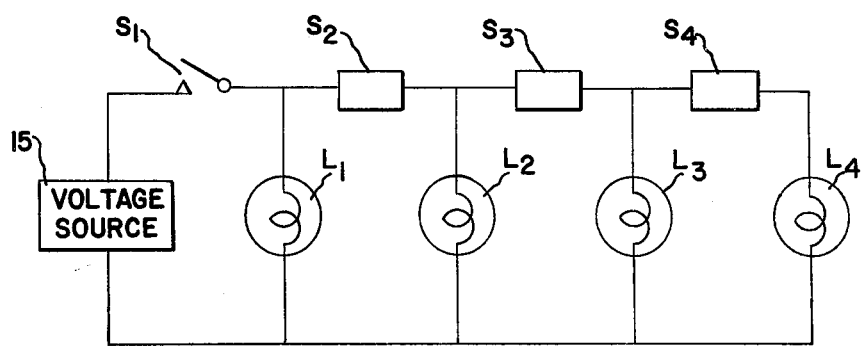

VOLTAGE RESPONSIVE SWITCHES AND METHODS OF MAKING

This is a division of application Ser. No. 554,724, filed Mar. 3, 1975, now U.S. Pat. No. 3,976,811.

The present invention relates to voltage responsive switches, and more particularly to methods of making voltage responsive switches characterized by an irreversible resistance change upon the application of a voltage greater than the threshold voltage of the switch.

Voltage responsive switches having bistable or memory characteristics have been utilized in a wide variety of electronic devices where such bistable switching or memory characteristics are desirable. For example, Sliva et al., describe in the Journal of Noncrystalline Solids, 2(1970) 316–333, the bistable switching and memory characteristics of a variety of amorphous, organic and polycrystalline materials. In general, these devices operate on the principle that the application of a voltage in excess of a threshold voltage causes a transition from a nonconducting state to a conducting state. Generally, the resistance in the nonconducting state is in the order of a megohm or more and the resistance of the conducting state is in the order of a 1000 ohms or less. The device is switched from its conducting state to its non-conducting state by a variety of techniques such as the application of a large AC voltage, a temperature or pressure shock, radiation or $rf$ currents. While these devices may be quite useful for their intended application, it is frequently desirable to provide a voltage-responsive switch which exhibits an irreversible resistance characteristic.

For example, in a photoflash unit including a plurality of flash lamps to be fired successively, a voltage sensitive switch characterized by an irreversible change in resistance is not only preferable, but imperative to insure highly reliably flash operation.

Accordingly, my invention relates to a method and apparatus for making a voltage sensitive switch characterized by a high resistance state of greater than a megohm and a low resistance state of less than approximately 100 ohms. Where utilized in a sequentially-fired photoflash unit, highly reliable switching characteristics are achieved in accord with my invention.

Briefly, in accord with one embodiment of my invention, a method of making an irreversible voltage sensitive switch comprises the steps of heating substantially pure grade copper powder of approximately 99.99% purity in an oxidizing atmosphere for a sufficient time to oxidize the outer surface of the copper powder. The oxidized copper powder is then mixed with a suitable binder, such as epoxy or nitrocellulose, to protect the oxidized copper powder from further oxidaton and for providing adhesion of the copper powder to a pair of spaced electrodes for providing the desired voltage responsive switch.

Further objects and advantages of my invention, along with a more complete description thereof, are provided in the following detailed description taken in conjunction with the accompanying drawings, in which:

FIG. 1 is a flow chart of the steps in the method of the present invention;

FIG. 2 illustrates the variation in threshold voltage for switches constructed in accord with my invention as a function of time and temperature; and FIG. 3 illustrates a voltage responsive switch constructed in accord with the present invention;

FIG. 4 illustrates a schematic diagram of the use of my voltage responsive switches in a sequentially operated photoflash device.

FIG. 1 illustrates a flow chart of a preferred method of making a voltage responsive switch characterized by an irreversible resistance change upon the application of a voltage greater than the threshold voltage of the switch. The method includes heating substantially pure grade copper powder of approximately 99.99% purity in an oxidizing atmosphere for a sufficient time and at an elevated temperature to oxidize the outer surface of the copper powder. In practicing my invention, I have found that highly reliable voltage responsive switches characterized by an irreversible resistance change are advantageously fabricated with copper powder of the aforementioned purity and of a particle size of between approximately 1 and 30 microns. Within this range, I have found that copper particles of between approximately 10 and 30 microns produce particularly desirable switching characteristics for use in sequentially operated photoflash units.

In practicing my invention, I have found that the oxidation of the copper particles varies as a function of time and temperature. More specifically, I have found that while oxidation of the copper particles will take place from room temperature up to approximately 130° C., the time required for oxidation varies inversely with the temperature. Further, I have found that the threshold voltage, that is the voltage at which the resulting changes from a high resistance to a low resistance, also varies with the time and temperature of oxidation. In general, I have found that the voltage threshold for these switches increases with increasing oxidation times for a constant spacing between the electrodes. FIG. 2 illustrates this characteristic which will now be described more fully below.

Continuing with the preferred method of making voltage responsive switches in accord with my invention, the oxidized copper powder is mixed with a binder, the amount being just sufficient to protect the oxidized copper powder from further oxidation. Then the oxidized copper-binder mixture is applied to a pair of spaced electrodes supported on a suitable nonconducting substrate. Suitable binders useful in practicing my invention are preferably of the organic type such as epoxy resins, anerobic adhesives, and nitrocellulose. These organic binders, when mixed with the oxidized copper powder in ratios of one part binder to 2 to 5 parts oxidized copper powder, provide a satisfactory coating over the oxidized copper powder to insure adequate protection of the oxidized copper powder from further oxidation while insuring adequate adhesion to the spaced electrodes to which the oxidized copper-binder is applied.

Those skilled in the art can readily appreciate that in the use of organic binders, it is frequently desirable to employ suitable thinners to provide a more workable slurry of materials. Obviously, these thinners are readily volatile and after having served their function, may be removed by moderate heating.

By way of more detailed description of the practice of my invention, reference is made to FIG. 2 wherein the variation in threshold voltage for a resultant voltage responsive switch is illustrated as a function of firing or heating times at temperatures of 70° C., 100° C. and 130° C to achieve the desired copper oxidation. As is readily apparent from the curves in which the spacing between the electrodes is approximately 100 mils, the threshold voltage for these switches increases with increasing time of oxidation. Further, for switches of instant threshold voltage, successively increasing amounts of time are required for oxidation where the oxidation is carried out at lower temperatures, i.e., see the temperature curves for 130° C., vis-a-vis 70° C.

FIG. 3 illustrates a typical embodiment of a voltage responsive switch 10 constructed in accord with my invention and comprising an insulating substrate or support member 11 with two spaced electrodes 12 supported thereon and an oxidized copper-binder 13 overlying a portion of the conductors 12, the gap therebetween and the substrate 11. In the practice of my invention, the spacing between the electrodes is advantageously between approximately 25 and 200 mils and preferably between 50 and 100 mils.

The operation of the voltage responsive switch 10 is described in conjunction with FIG. 4 wherein a plurality of flash lamps $L_1$, $L_2$, $L_3$ and $L_4$ are sequentially connected to a voltage source 15 through a plurality of switches $S_1$, $S_2$, $S_3$ and $S_4$. The switch $S_1$ is a mechanically actuated momentary switch, preferably one synchronized with the shutter opening of a camera. Alternately, the voltage source 15 could be a piezoelectric generator, which produces an output voltage each time the piezoelectric element is struck mechanically, thereby obviating the need for switch $S_1$.

Operationally, upon closure of switch $S_1$ and the voltage from the source 15, the flash lamp $L_1$ is fired. Since switch $S_2$ is in its high resistance state, substantially all current is shunted through the flash lamp $L_1$ and none through $L_2$. Upon a subsequent closing of switch $S_1$, however, the flash lamp $L_1$ now appears as an open circuit and the source voltage 15 is applied directly to the series combination of switch $S_2$ and photolamp $L_2$. As soon as the threshold voltage of switch $S_2$ is exceeded, the impedance or resistance of the switch $S_2$ changes from a high value, i.e., in excess of several megohms to less than approximately 100 ohms, and current from the source 15 flows through the switch $S_2$ and lamp $L_2$ thereby causing photolamp $L_2$ to fire. With each successive closure of switch $S_1$, lamps $L_3$ and $L_4$ fire in a similar manner.

In accord with one of the unique features of my invention, the voltage responsive switches $S_2$, $S_3$ and $S_3$ remain in their highly conductive state irreversibly after their threshold voltage is once exceeded. This characteristic feature of my invention is particularly significant in the operation of sequentially fired photolamps where an extremely high degree of reliability is required for sequential firing of photolamps. Since the ambient conditions under which sequentially operated photoflash units are uncontrollable, it is essential that the switching elements exhibit an irreversible change in resistance. In accord with my invention, this irreversible characteristic is assured, thereby insuring reliable operation of sequentially operated flash units.

In summary, I have disclosed a novel method of making voltage responsive switches characterized by an irreversible change in resistance upon application of a voltage in excess of the threshold voltage of the switch. Highly reliable and low cost switches are thereby provided.

In view of the foregoing description, it will be apparent to those skilled in the art that various modifications may be made within the spirit and scope of the present invention. For example, whereas the present invention is described for use in a photoflash unit, obviously these voltage responsive switches can be utilized in various electrical circuits for providing voltage protection. Accordingly, the appended claims are intended to cover all such modifications and variations as fall within the true spirit and scope of this invention.

What is claimed as new is:

1. An irreversible voltage sensitive switch characterized by a first high resistance state of greater than approximately a megohm and a second low resistance state of less than approximately a hundred ohms, said switch comprising:
   a pair of spaced electrodes on a support member; and
   a mixture of a substantially pure grade copper powder having an oxidized outer surface and an organic binder overlying a portion of said spaced electrodes, the space therebetween and said support member, said mixture including approximately one part binder to two to five parts oxidized copper powder.

2. The switch of claim 1 wherein said electrodes are spaced approximately 25 to 200 mils apart.

3. The switch of claim 1 wherein said oxidized copper powder has a particle size of between one and thirty microns.

4. The switch of claim 1 further comprising:
   a flash lamp connected in electrical series relationship with said switch;
   a voltage source; and
   means for connecting said voltage source to said switch and said flash lamp.

5. The switch of claim 4 wherein said voltage source comprises a piezoelectric generator.

6. The switch of claim 4 comprising a plurality of flash lamps and switches each operatively connected in electrical series relationship for sequential firing of said flash lamps.

* * * * *